US010581166B2

(12) United States Patent
Hu

(10) Patent No.: US 10,581,166 B2
(45) Date of Patent: Mar. 3, 2020

(54) RECONFIGURABLE MULTI-BAND ANTENNA WITH INDEPENDENT CONTROL

(71) Applicant: Smart Antenna Technologies Ltd., Birmingham (GB)

(72) Inventor: Sampson Hu, Birmingham (GB)

(73) Assignee: Smart Antenna Technologies Ltd., Birmingham (GB)

(*) Notice: Subject to any disclaimer, the term of this patent is extended or adjusted under 35 U.S.C. 154(b) by 64 days.

(21) Appl. No.: 15/508,788

(22) PCT Filed: Sep. 4, 2015

(86) PCT No.: PCT/GB2015/052549
§ 371 (c)(1),
(2) Date: Mar. 3, 2017

(87) PCT Pub. No.: WO2016/034885
PCT Pub. Date: Mar. 10, 2016

(65) Prior Publication Data
US 2017/0264018 A1    Sep. 14, 2017

(30) Foreign Application Priority Data
Sep. 5, 2014   (GB) .................................. 1415780.4

(51) Int. Cl.
*H01Q 5/335*    (2015.01)
*H01P 1/213*    (2006.01)
(Continued)

(52) U.S. Cl.
CPC ............. *H01Q 5/335* (2015.01); *H01P 1/213* (2013.01); *H01Q 1/2266* (2013.01);
(Continued)

(58) Field of Classification Search
CPC ...... H01Q 5/335; H01Q 1/2266; H01Q 1/242; H01Q 1/48; H01P 1/213; H01P 1/20345
See application file for complete search history.

(56) References Cited

U.S. PATENT DOCUMENTS 6,362,793 B1    3/2002    Sawamura et al.
6,426,723 B1    7/2002    Smith
(Continued)

FOREIGN PATENT DOCUMENTS

EP    1154513 A1    11/2001
EP    1772930 A1    4/2007
(Continued)

OTHER PUBLICATIONS

Communication pursuant to Article 94(3) EPC from counterpart European Patent Application No. 15762680.5, dated May 2, 2018, 7 pp.
(Continued)

*Primary Examiner* — Daniel Munoz
*Assistant Examiner* — Bamidele A Jegede
(74) *Attorney, Agent, or Firm* — Shumaker & Sieffert, P.A.

(57) ABSTRACT

There is disclosed a multi-band reconfigurable antenna device having at least one radiating element. The radiating element is connected to a single port by way of at least first and second matching circuits arranged in parallel. A high pass filter is provided between the first matching circuit and the radiating element so as to allow passage of a first, higher frequency RF signal through the first matching circuit. A low pass filter is provided between the second matching circuit and the at least one radiating element so as to allow passage of a second, lower frequency RF signal through the second matching circuit. The high pass filter blocks passage of the second, lower frequency RF signal through the first match-
(Continued)

ing circuit, and the low pass filter blocks passage of the first, higher frequency RF signal through the second matching circuit. The first and second matching circuits are adjustable independently of each other so as to allow the first and second RF signals to be tuned independently of each other.

17 Claims, 9 Drawing Sheets

(51) Int. Cl.
*H01Q 1/22* (2006.01)
*H01Q 1/24* (2006.01)
*H01Q 1/48* (2006.01)
H01P 1/203 (2006.01)
H03H 7/38 (2006.01)

(52) U.S. Cl.
CPC .............. *H01Q 1/242* (2013.01); *H01Q 1/48* (2013.01); *H01P 1/20345* (2013.01); *H03H 7/383* (2013.01)

(56) References Cited

U.S. PATENT DOCUMENTS

| | | | |
|---|---|---|---|
| 6,433,749 B1 | 8/2002 | Thompson | |
| 8,648,756 B1 | 2/2014 | Desclos et al. | |
| 9,241,050 B1 | 1/2016 | Asrani et al. | |
| 2003/0189519 A1 | 10/2003 | Rutfors et al. | |
| 2004/0032706 A1* | 2/2004 | Kemmochi | H03H 7/465 361/306.3 |
| 2004/0075614 A1 | 4/2004 | Dakeya et al. | |
| 2005/0012675 A1 | 1/2005 | Sakiyama et al. | |
| 2005/0093645 A1* | 5/2005 | Watanabe | H03H 7/383 333/101 |
| 2007/0001911 A1 | 1/2007 | Fujio et al. | |
| 2007/0024513 A1 | 2/2007 | Sako | |
| 2007/0057854 A1 | 3/2007 | Oodachi et al. | |
| 2007/0190954 A1* | 8/2007 | Murakami | H03H 7/38 455/132 |
| 2007/0241985 A1* | 10/2007 | Suzuki | H01Q 1/50 343/860 |
| 2007/0268191 A1 | 11/2007 | Ishizuka et al. | |
| 2007/0279287 A1 | 12/2007 | Castaneda et al. | |
| 2007/0291831 A1 | 12/2007 | Lee et al. | |
| 2008/0062335 A1* | 3/2008 | Ho | H03J 3/185 348/733 |
| 2008/0079640 A1 | 4/2008 | Yang | |
| 2008/0106476 A1 | 5/2008 | Tran et al. | |
| 2008/0111746 A1 | 5/2008 | Levy et al. | |
| 2008/0204163 A1* | 8/2008 | Royak | H01P 1/20345 333/132 |
| 2008/0238789 A1* | 10/2008 | Wilcox | H04B 1/0458 343/750 |
| 2008/0316116 A1 | 12/2008 | Hobson et al. | |
| 2009/0102742 A1 | 4/2009 | Park et al. | |
| 2009/0115673 A1* | 5/2009 | Nysen | H01Q 1/2275 343/730 |
| 2009/0207092 A1 | 8/2009 | Nysen et al. | |
| 2009/0231200 A1 | 9/2009 | Chiu et al. | |
| 2009/0273521 A1* | 11/2009 | Wong | H01Q 1/38 343/700 MS |
| 2009/0273531 A1 | 11/2009 | Ishizuka et al. | |
| 2010/0045540 A1 | 2/2010 | Lai et al. | |
| 2010/0073247 A1* | 3/2010 | Arkko | H01Q 1/243 343/745 |
| 2010/0090917 A1* | 4/2010 | Roeckl | H04B 1/0053 343/722 |
| 2010/0220022 A1 | 9/2010 | Yoon et al. | |
| 2010/0321130 A1* | 12/2010 | Kim | H01P 1/213 333/126 |
| 2011/0287731 A1 | 11/2011 | Hase | |
| 2013/0002501 A1 | 1/2013 | Li et al. | |
| 2013/0076579 A1 | 3/2013 | Zhang et al. | |
| 2013/0076580 A1 | 3/2013 | Zhang et al. | |
| 2013/0076587 A1 | 3/2013 | Wong et al. | |
| 2013/0203364 A1 | 8/2013 | Darnell et al. | |
| 2013/0307742 A1 | 11/2013 | Hu et al. | |
| 2013/0314297 A1 | 11/2013 | Hamabe | |
| 2014/0011460 A1 | 1/2014 | Ali et al. | |
| 2014/0028525 A1 | 1/2014 | Ying | |
| 2014/0055209 A1* | 2/2014 | Ishizuka | H03H 7/38 333/129 |
| 2014/0085160 A1* | 3/2014 | Valkonen | H01Q 5/335 343/860 |
| 2014/0106684 A1 | 4/2014 | Burns et al. | |
| 2014/0159971 A1* | 6/2014 | Hall | H01Q 1/243 343/745 |
| 2015/0194738 A1* | 7/2015 | Hu | H01Q 1/243 343/727 |
| 2015/0200459 A1* | 7/2015 | Wang | H01Q 1/1242 343/700 MS |
| 2016/0087328 A1* | 3/2016 | Lee | H01Q 5/307 343/702 |

FOREIGN PATENT DOCUMENTS

| | | |
|---|---|---|
| EP | 2091103 A1 | 8/2009 |
| EP | 2518824 A1 | 10/2012 |
| EP | 2683027 A1 | 1/2014 |
| GB | 2507788 A | 5/2014 |
| JP | 2007221344 A | 8/2007 |
| JP | 2012209712 A | 10/2012 |
| JP | 2014086949 A | 5/2014 |
| WO | 2013014458 A1 | 1/2013 |
| WO | 2014020302 A1 | 2/2014 |

OTHER PUBLICATIONS

International Search Report and Written Opinion for corresponding PCT Application No. PCT/GB2015/052549, dated Nov. 25, 2015 (17 pgs.).
Response to Communication dated May 2, 2018, from counterpart European Patent Application No. 15762680.5, filed Sep. 3, 2018, 22 pp.

* cited by examiner

RECONFIGURABLE MULTI-BAND ANTENNA WITH INDEPENDENT CONTROL

This application is a national stage application under 35 U.S.C. § 371 of PCT Application No. PCT/GB2015/052549, filed Sep. 4, 2015, which claims the benefit of Great Britain Application No. 1415780.4, filed Sep. 5, 2014. The entire contents of each of PCT Application No. PCT/GB2015/052549 and Great Britain Application No. 1415780.4 are incorporated herein by reference in their entirety.

This invention relates a multi-band antenna. Particularly, but not exclusively, the invention relates to a multi-band antenna for use in a portable electronic device such as a mobile phone handset, laptop, tablet, femtocell, wireless router or other radio communications device.

BACKGROUND

Today's mobile devices require integration of an ever increasing number of radio functions and frequencies (Bluetooth, WiFi, GNSS, GSM, 3G, LTE) over a proliferating number of bands (40+ for LTE alone). Most antennas that are designed to cover a very wide frequency range are generally referred to as broadband antennas. Broadband antennas are generally inefficient due to their wide frequency coverage, whilst higher efficiency narrow band antenna do not cover the required frequency range. Size is a further constraint which diminishes efficiency due to the drive to more compact antennas, and this also introduces severe isolation issues especially for MIMO. Mobile device antennas need to be efficient in order to conserve battery life and maintain coverage. Current implementations use up to six antennas to overcome this trade-off with the penalty of cost, size and lack of flexibility.

There are many proposals for reconfigurable antenna designs which would help to alleviate this problem. It is known to provide a reconfigurable antenna such as described in WO 2011/048357 (the content of which is incorporated into the present disclosure by reference) which has an extremely wide tuning range. However, this antenna is only able to access two services simultaneously. For example, the antenna can only support DVB-H (470 MHz) and GSM (900 MHz) signals or DVB-H (470 MHz) and WiFi (2400 MHz) or GSM (900 MHz) and GPS (1500 MHz) but it cannot support more than two of these services simultaneously, as required by current mobile devices which can require simultaneous access to GSM, GPS and WiFi. Furthermore, this particular antenna is unlikely to be adequate for future Cognitive Radio systems which will require multi-resolution spectrum sensing.

If multi-services or multi-spectrum sensing is required in the future then one solution would be to use more reconfigurable antennas. However, as mentioned above, providing multiple antennas in a small device is impracticable and so the system designers still need to address the problem concerning the small amount of space available to provide such services.

It is known from WO 2013/014458 (the content of which is incorporated into the present disclosure by reference) to provide a multi-output antenna in which each radiating element of an antenna device is connected to at least two matching circuits, and wherein each matching circuit is associated with a separate port arranged to drive a separate frequency such that each radiating element is operable to provide multiple outputs simultaneously. The separate frequencies may be adjusted independently of each other as required by adjusting the respective matching circuits, and this can be done with good isolation between the ports thereby offering very wide operating frequency range with simultaneous multi-independent output operations. Thus, the multiple outputs/ports may have independent frequency control (i.e. when the resonant frequency of port one is changed, the resonant frequency of port two will be unaffected and will remain the same).

Accordingly, a single antenna of the type disclosed in WO 2013/014458 can mimic the output from multiple separate antennas, while occupying less space than that required for such multiple separate antennas. This also allows use of fewer radiating elements, thus also reducing the problems associated with the coupling of separate radiating elements when they are placed in close proximity. Furthermore, as the matching circuits may be permanently coupled to the radiating elements so that the ports can be operated simultaneously, this can negate the need for switches and other complex circuitry required in order to select or isolate a particular output.

However, there are circumstances where it is not appropriate to provide a plurality of separate ports for each individual radiating element.

It is known from US 2007/0241985 to provide a dual band TV antenna device having first and second matching circuits arranged in parallel branches. The first matching circuit is adapted for impedance matching in a first frequency band, and the second matching circuit is adapted for impedance matching in a second frequency band. An incoming RF signal received by the antenna device is split into first and second frequency bands by way of appropriate filters. A switch is provided so as to select one or other of the first frequency band and the second frequency band for connected to a TV receiver. Accordingly, the first and second frequency bands are not used simultaneously. An alternative embodiment, shown in FIGS. 12 to 14, dispenses with the switch, and instead provides an additional filter between each matching circuit and the output port. However, as is made clear at paragraphs [0077] to [0080] and [0083] to [0084] of US 2007/0241985, only one of the two frequency bands is ever processed at any particular time. If the TV receiver is set to receive a channel in the FM/VHF band, then only the FM/VHF band signal is matched and tuned. Conversely, if the TV receiver is set to receive a channel in the UHF band, then only the UHF band signal is matched and tuned. There is no suggestion that the FM/VHF and the UHF bands are to be matched and tuned at the same time, with RF signals in each band being tuneable independently of those in the other band.

BRIEF SUMMARY OF THE DISCLOSURE

Viewed from a first aspect, there is provided a multi-band reconfigurable antenna device comprising at least one radiating element having a single feed, the single feed of the at least one radiating element being connected to a single port by way of at least first and second matching circuits arranged in parallel, wherein a high pass filter is provided between the first matching circuit and the single feed so as to allow passage of a first, higher frequency RF signal through the first matching circuit, wherein a low pass filter is provided between the second matching circuit and the single feed so as to allow passage of a second, lower frequency RF signal through the second matching circuit, wherein the high pass filter blocks passage of the second, lower frequency RF signal through the first matching circuit and wherein the low pass filter blocks passage of the first, higher frequency RF signal through the second matching circuit, the first and second matching circuits being adjustable independently of each other so as to allow the first and second RF signals to be simultaneously dynamically tuned independently of each other before the first and second RF signals are applied together to the single port for subsequent signal processing.

A reconfigurable antenna is an antenna capable of modifying dynamically its frequency and radiation properties in a controlled and reversible manner. In order to provide a dynamical response, reconfigurable antennas integrate an inner mechanism (such as RF switches, varactors, mechanical actuators or tuneable materials) that enable the intentional redistribution of the RF currents over the antenna surface and produce reversible modifications over its properties. Reconfigurable antennas differ from smart antennas because the reconfiguration mechanism lies inside the antenna rather than in an external beamforming network. The reconfiguration capability of reconfigurable antennas is used to maximize the antenna performance in a changing scenario or to satisfy changing operating requirements.

Embodiments of the present antenna device allow the first and second RF signals to be tuned by adjusting the matching circuits such that the resonant frequencies of the first and second RF signals can both be changed, independently of each other, and at the same time, while the antenna device is in operation. In this way, the antenna device can dynamically adapt to different environments and to different transmission/reception requirements while in operation.

In particular, no additional high pass/low pass/band pass filters are required between the matching circuits and the single port, since the present antenna device is configured to match, tune and pass RF signals in at least two different bands simultaneously.

The antenna device may further comprise a conductive groundplane, and be configured such that the first and second RF signals of different frequencies excite first and second simultaneous different resonances on the groundplane.

Importantly, the first and second RF signals, which may be at first and second resonant frequencies, can be tuned independently of each other by adjusting the matching circuits. That is, the resonant frequency of the first RF signal may be changed by adjusting the first matching circuit without affecting the resonant frequency of the second RF signal and vice versa. In some embodiments, the first and second matching circuits may both be adjusted at the same time so as to change the resonant frequencies of the first and second RF signals simultaneously, and without significant interaction between the first and second RF signals.

The first and second resonances on the groundplane may take the form of surface current distributions, and the matching circuits and groundplane geometry may be configured so that the first and second surface currents are distributed over different regions of the groundplane so as to reduce interactions with each other. This may be because the impedances for the first and second resonances are improved by way of the first and second matching circuits. This facilitates independent tuning of the first and second resonant frequencies.

Therefore, in some embodiments, one radiating element can support two bands, and N elements can provide N×2 band simultaneous operation.

In some embodiments, additional independently tuneable RF signals can be received and/or transmitted by incorporating additional high pass and/or low pass filters. For example, one or more radiating elements may be configured to receive more than two RF signals of different frequencies, and these signals may be combined on a single carrier as a multiplexed signal. The multiplexed signal may be supplied to a first high pass filter and a first low pass filter arranged in parallel. The first high pass filter may in turn be connected to a second high pass filter and a second low pass filter arranged in parallel, each of the second high pass filter and second low pass filter being connected in series with a matching circuit as previously described. A similar arrangement may be provided for the first low pass filter. This allows the antenna device to handle as many independently tuneable RF signals as there are matching circuits, the matching circuits being arranged in parallel. This may allow a single radiating element to support more than two bands, with N elements providing N×m band simultaneous operation, where m is the number of supported bands.

Embodiments of the antenna are advantageous where a mixed signal RF module is employed, the RF module requiring one port but supporting multiple bands.

Alternatively or in addition, the first and second RF signals can be separated from each other downstream of the single port by using a diplexer. Where more than two RF signals need to be separated, an appropriate multiplexer may be used.

BRIEF DESCRIPTION OF THE DRAWINGS

Embodiments of the invention are further described hereinafter with reference to the accompanying drawings, in which.

DETAILED DESCRIPTION

Figure 1:
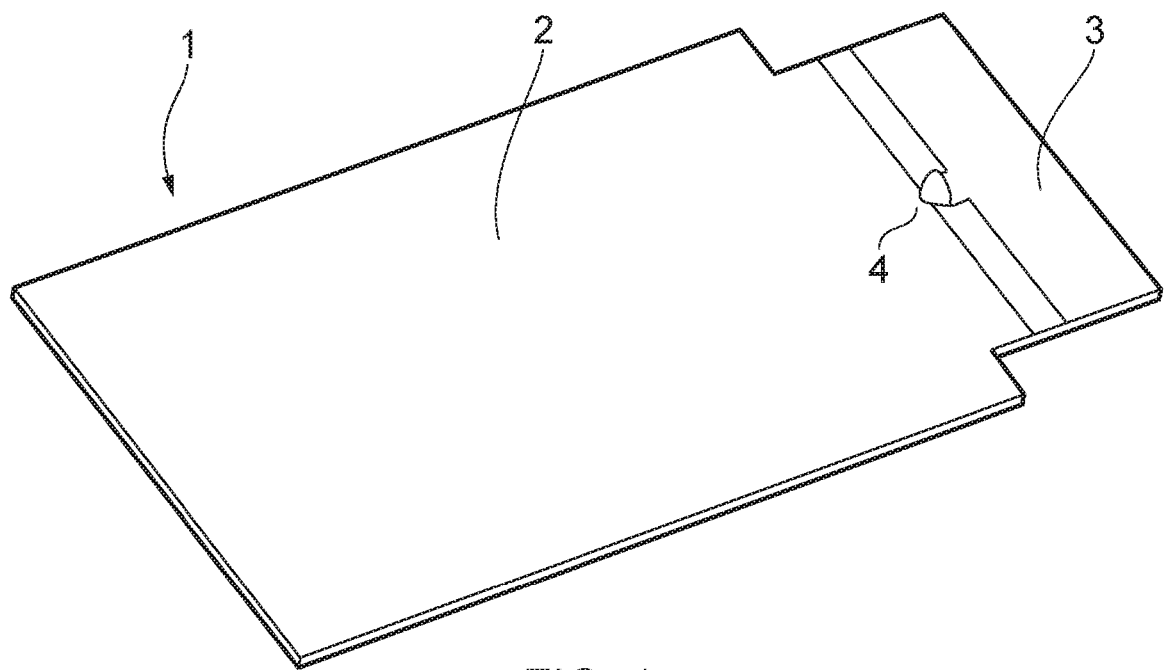
FIG. 1 shows an antenna suitable for use with embodiments of the present invention.

FIG. 1 shows an example of an antenna that may be used with the present invention. There is provided a substrate 1, for example a PCB, having a conductive groundplane 2 over a majority of one surface thereof. One end of the substrate 1 is free of the groundplane 2, and is provided with a radiating element 3 formed as a conductive strip. The radiating element 3 is fed at a feed point 4, which is connected to matching circuitry and a signal port (not shown) mounted on the substrate 1. In this particular example, the radiating element 3 is an unbalanced chassis antenna that is driven against the groundplane 2, but other antennas, including balanced antennas, monopoles, dipoles, PIFAs, PILAs, loop antennas etc. may be used with certain embodiments.

Figure 2:
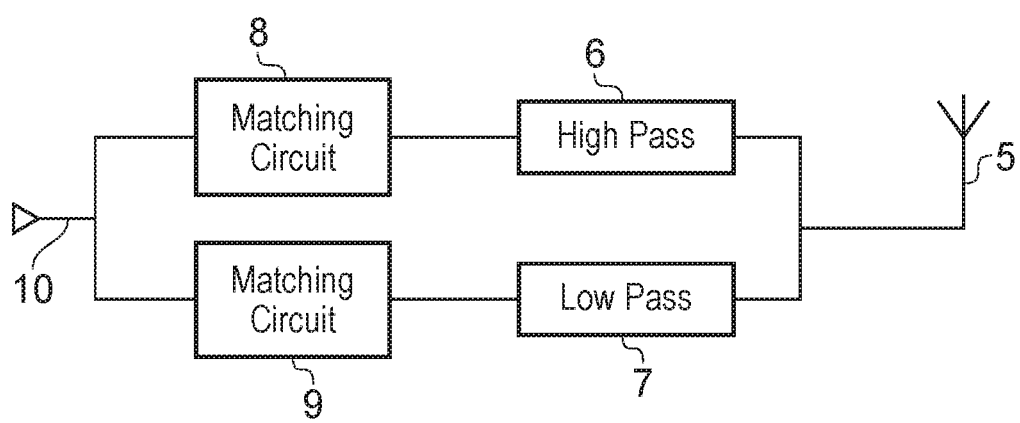
FIG. 2 shows a system block of a first embodiment.

FIG. 2 is a system block showing a first embodiment. An antenna 5 (for example as shown in FIG. 1) is connected to a high pass filter 6 and a low pass filter 7 that are arranged in parallel. The high pass filter 6 is in turn connected to a first matching circuit 8, and the low pass filter 7 to a second matching circuit 9. The first and second matching circuits 8, 9 are arranged in parallel, and are both in turn connected to a single signal port 10. The high pass filter 6 allows passage of a first, higher frequency RF signal through the first matching circuit 8. The low pass filter 7 allows passage of a second, lower frequency RF signal through the second matching circuit 9. The high pass filter 6 blocks passage of the second, lower frequency RF signal through the first matching circuit 8, and the low pass filter 7 blocks passage of the first, higher frequency RF signal through the second matching circuit 9. The first and second matching circuits 8, 9 are adjustable independently of each other so as to allow the first and second RF signals to be tuned independently of each other.

Figure 3:
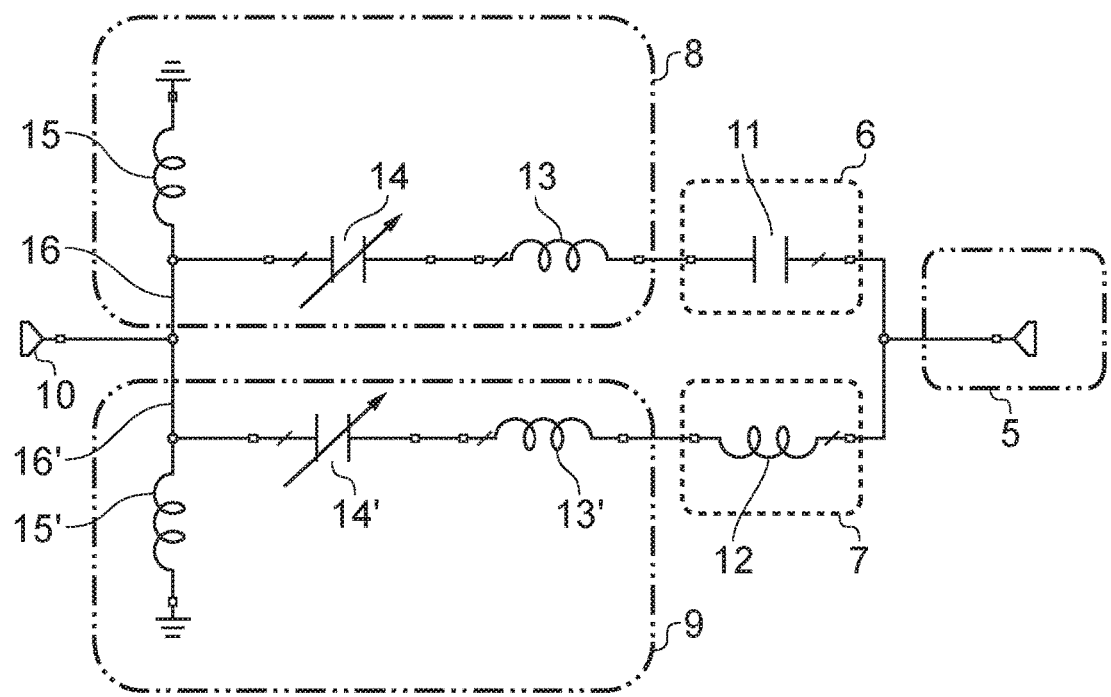
FIG. 3 shows a first exemplary circuit schematic for the first embodiment.

FIG. 3 is a circuit schematic showing details of one possible implementation of the system block of FIG. 2. The high pass filter 6 may be configured as a capacitor 11, and the low pass filter 7 may be configured as an inductor 12. The first matching circuit 8 may comprise an inductor 13 in series with a variable capacitor 14, with a connection to ground by way of a further inductor 15 and a connection 16 to the signal port 10. The second matching circuit 9 is similarly configured, comprising an inductor 13' in series with a variable capacitor 14', with a connection to ground by way of a further inductor 15' and a connection 16' to the signal port 10.

Figure 4:
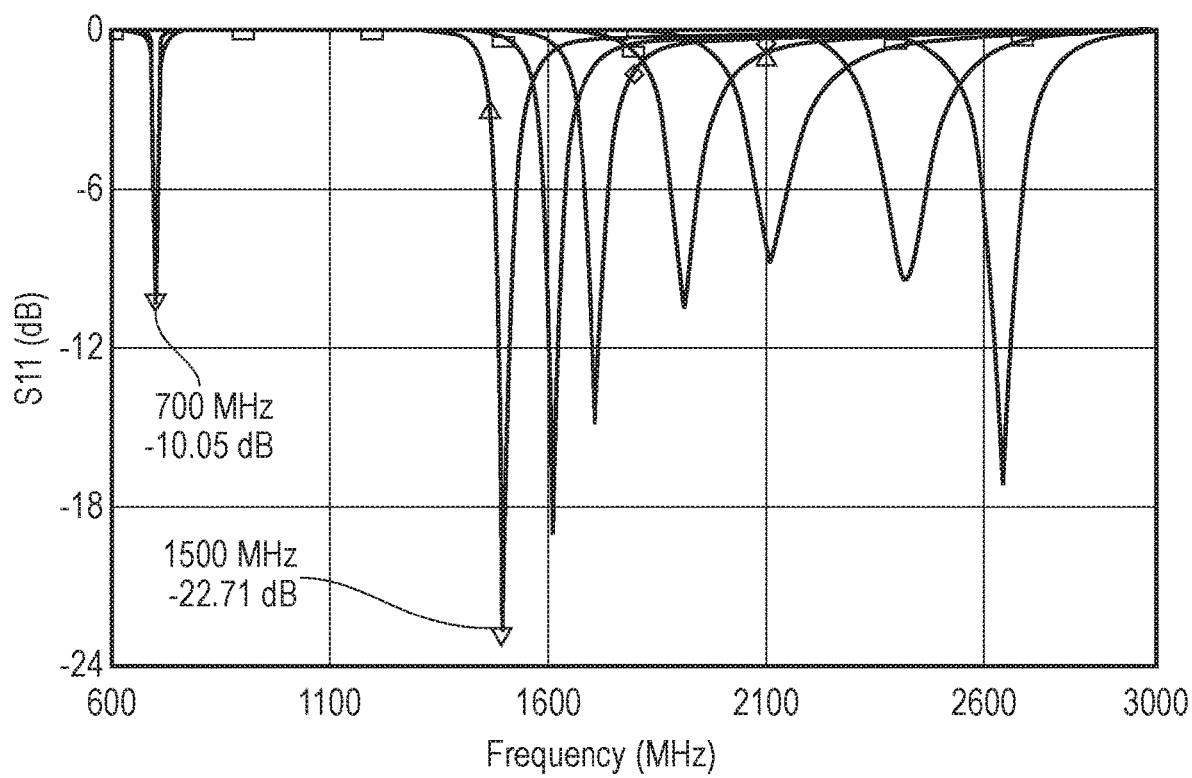
FIG. 4 shows a first return loss plot for the first embodiment.

FIG. 4 shows an S11 return loss plot showing how the first, higher frequency RF signal can be tuned between 1500 MHz and 2700 MHz while the second, lower frequency RF signal is kept tuned to 700 MHz. This is done by adjusting the variable capacitor 14 in the first matching circuit 8.

Figure 5:
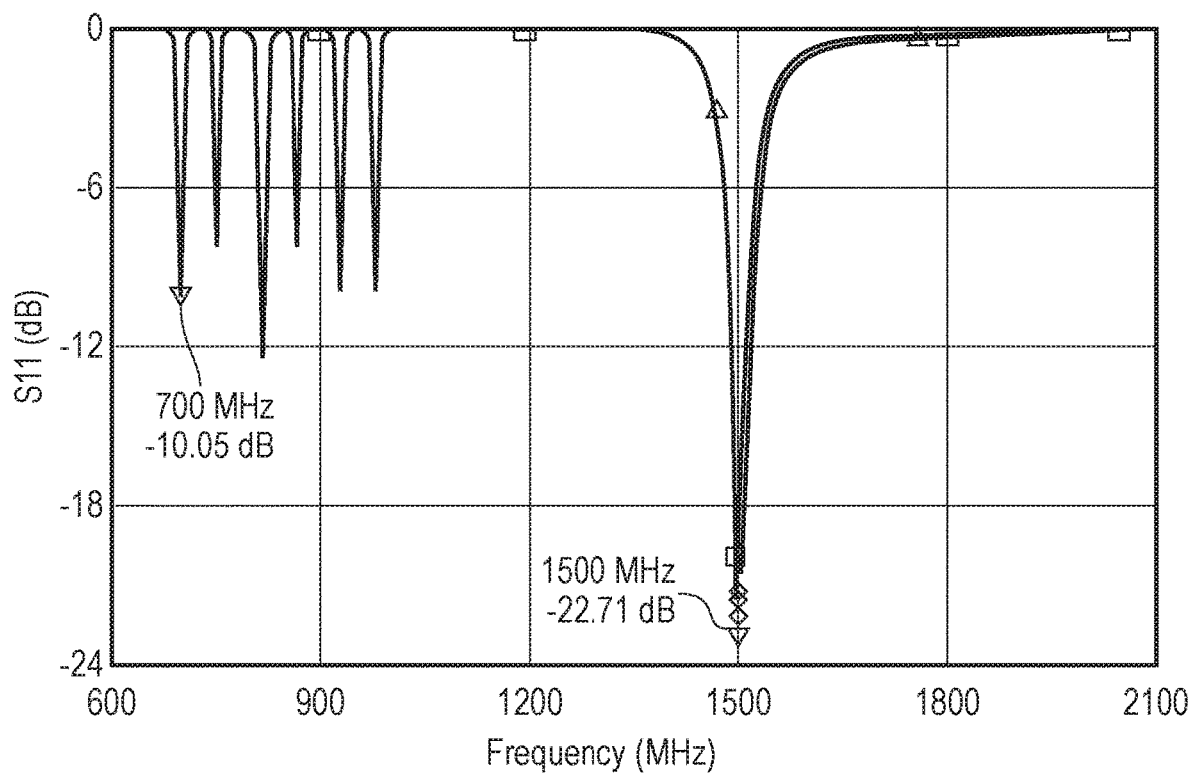
FIG. 5 shows a second return loss plot for the first embodiment.

FIG. 5 shows an S11 return loss plot showing how the second, lower frequency RF signal can be tuned between 700 MHz and 960 MHz while the first, higher frequency RF signal is kept tuned to 1500 MHz. This is done by adjusting the variable capacitor 14' in the second matching circuit 9.

Figure 6:
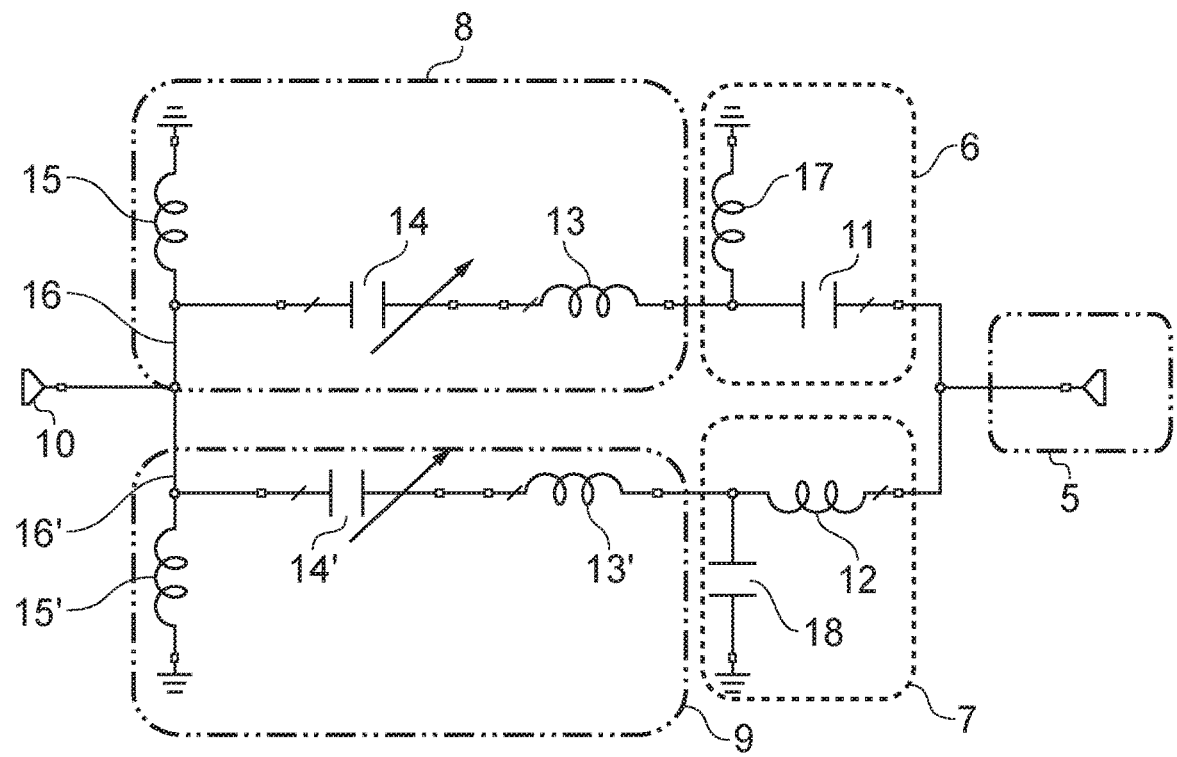
FIG. 6 shows a second exemplary circuit schematic for the first embodiment.

FIG. 6 is a circuit schematic showing an alternative implementation to that of FIG. 3, where the high pass filter 6 includes an additional inductive connection 17 to ground, and the low pass filter 7 includes an additional capacitive connection 18 to ground.

Figure 7:
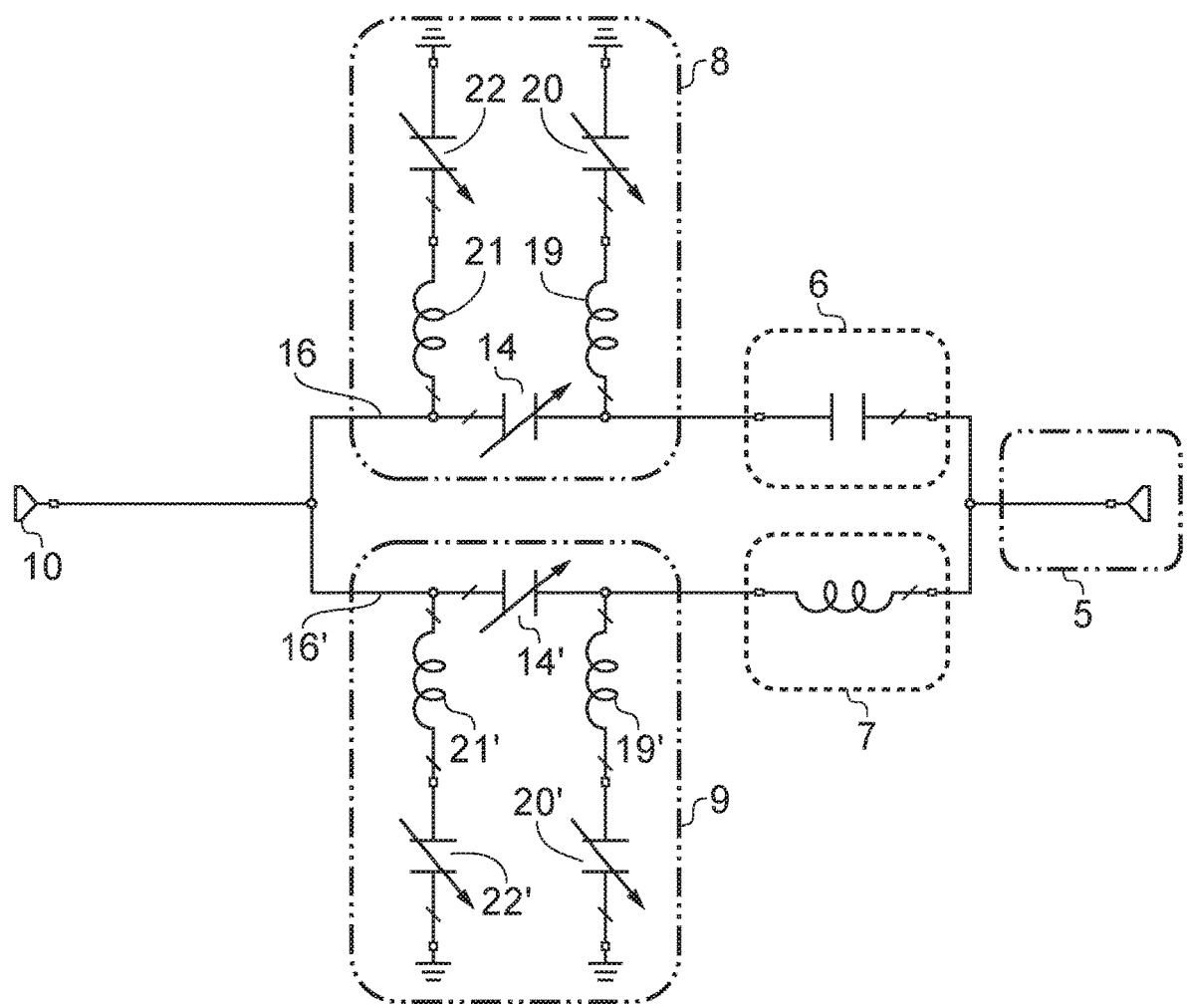
FIG. 7 shows a third exemplary circuit schematic for the first embodiment.

FIG. 7 is a circuit schematic showing a further alternative implementation to that of FIG. 3, where the variable capacitor 14, 14' in each matching circuit 8, 9 is provided on one side with a connection to ground by way of an inductor 19, 19' and a variable capacitor 20, 20', and on the other side with a connection to ground by way of an inductor 21, 21' and a variable capacitor 22, 22'.

Figure 8:
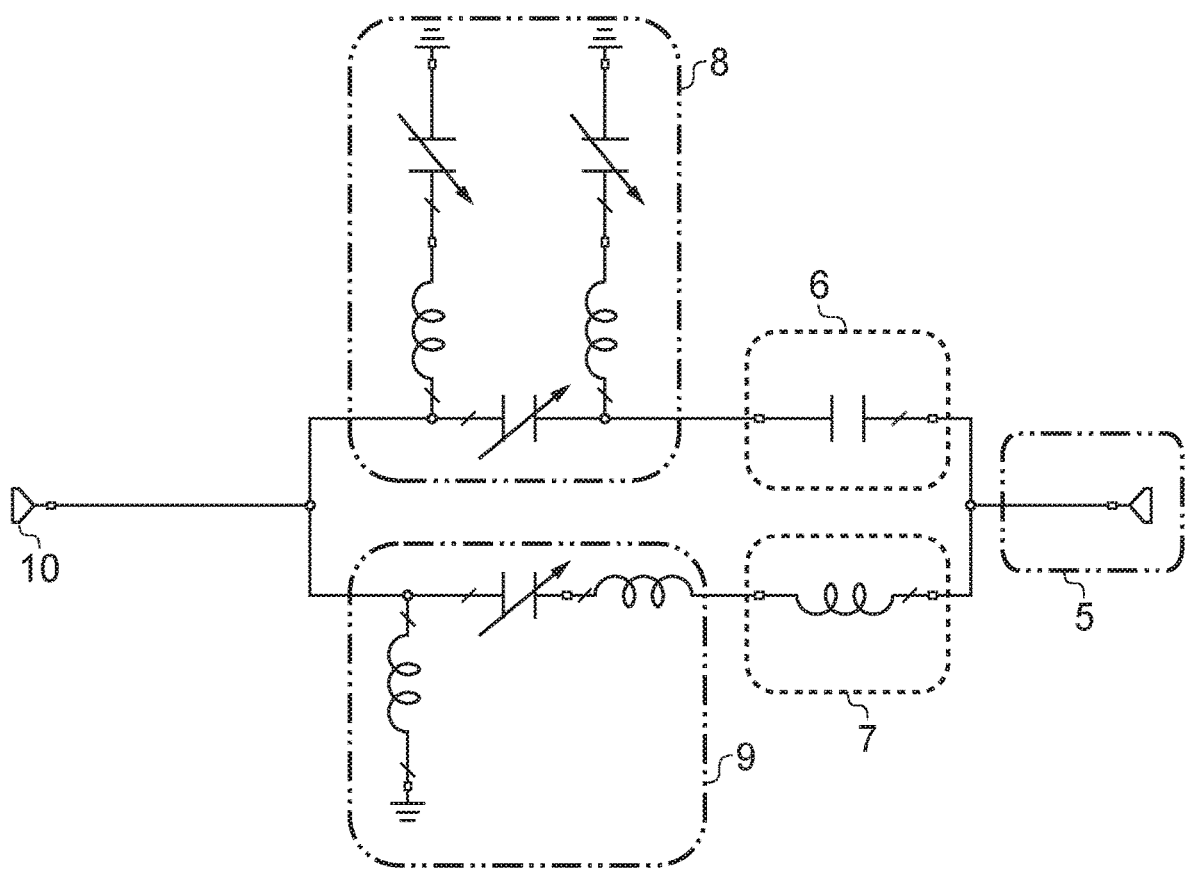
FIG. 8 shows a fourth exemplary circuit schematic for the first embodiment.

FIG. 8 is a circuit schematic showing a further alternative implementation, in which the first matching circuit 8 is configured as in FIG. 7, and the second matching circuit 9 is configured as in FIG. 3.

Figure 9:
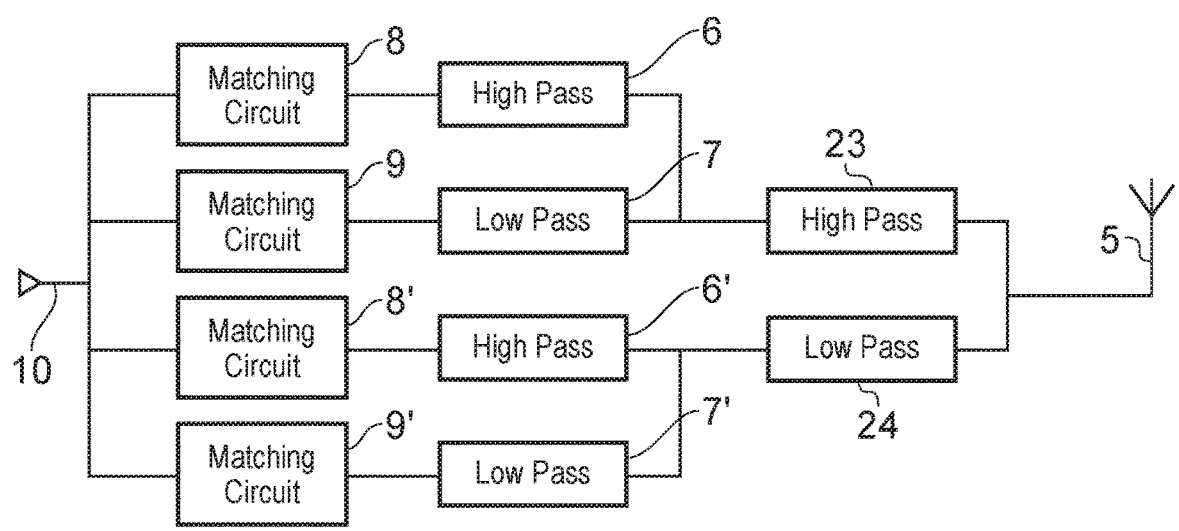
FIG. 9 shows a system block of a second embodiment.

FIG. 9 is a system block showing a further development. Here, the mixed RF signal from the antenna 5 is split by a first high pass filter 23 and a first low pass filter 24. The first high pass filter 23 is in turn connection to a high pass filter 6 and a low pass filter 7 that are arranged in parallel. The high pass filter 6 is connected to a first matching circuit 8, and the low pass filter 7 to a second matching circuit 9. The first and second matching circuits 8, 9 are arranged in parallel, and are both in turn connected to a single signal port 10. The first low pass filter 24 is in turn connection to a high pass filter 6' and a low pass filter 7' that are arranged in parallel. The high pass filter 6' is connected to a first matching circuit 8', and the low pass filter 7' to a second matching circuit 9'. The first and second matching circuits 8', 9' are arranged in parallel, and are both in turn connected to a single signal port 10. In this way, four separate RF signals can be independently tuned by the four matching circuits 8, 9, 8', 9'.

Figure 10:
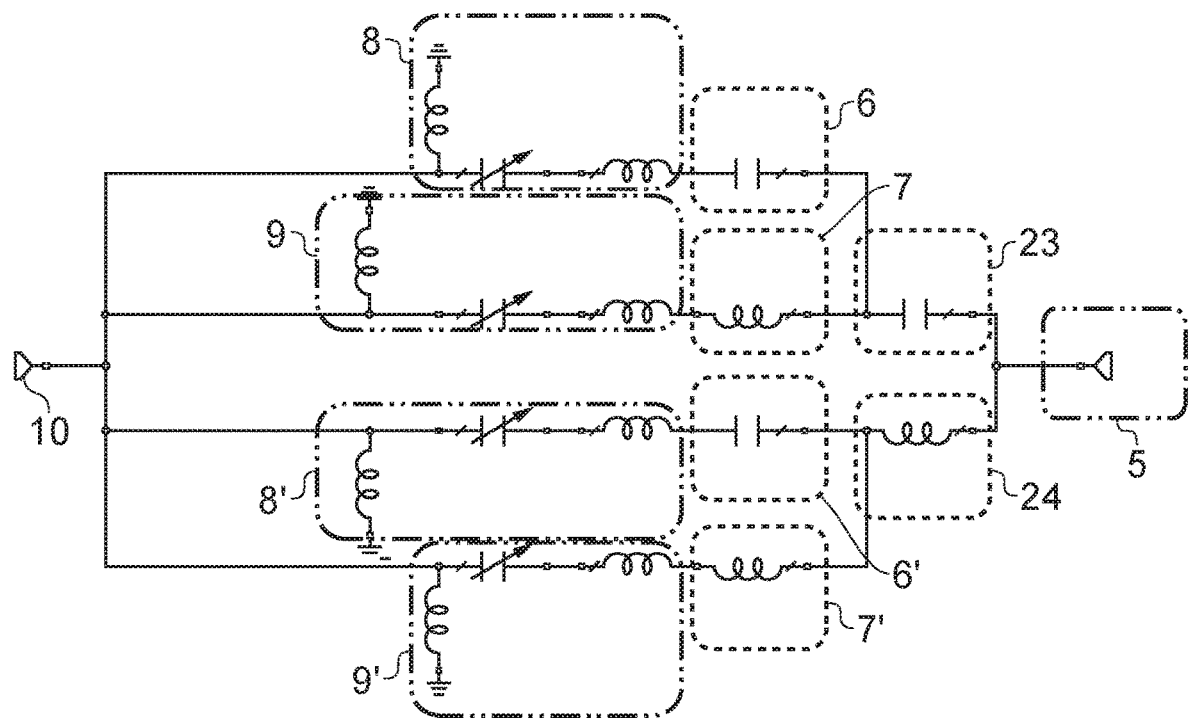
FIG. 10 shows an exemplary circuit schematic for the second embodiment.

FIG. 10 shows a circuit schematic illustrating one possible way in which the system block of FIG. 9 may be implemented, which will be understood with reference to FIG. 3.

Figure 11:
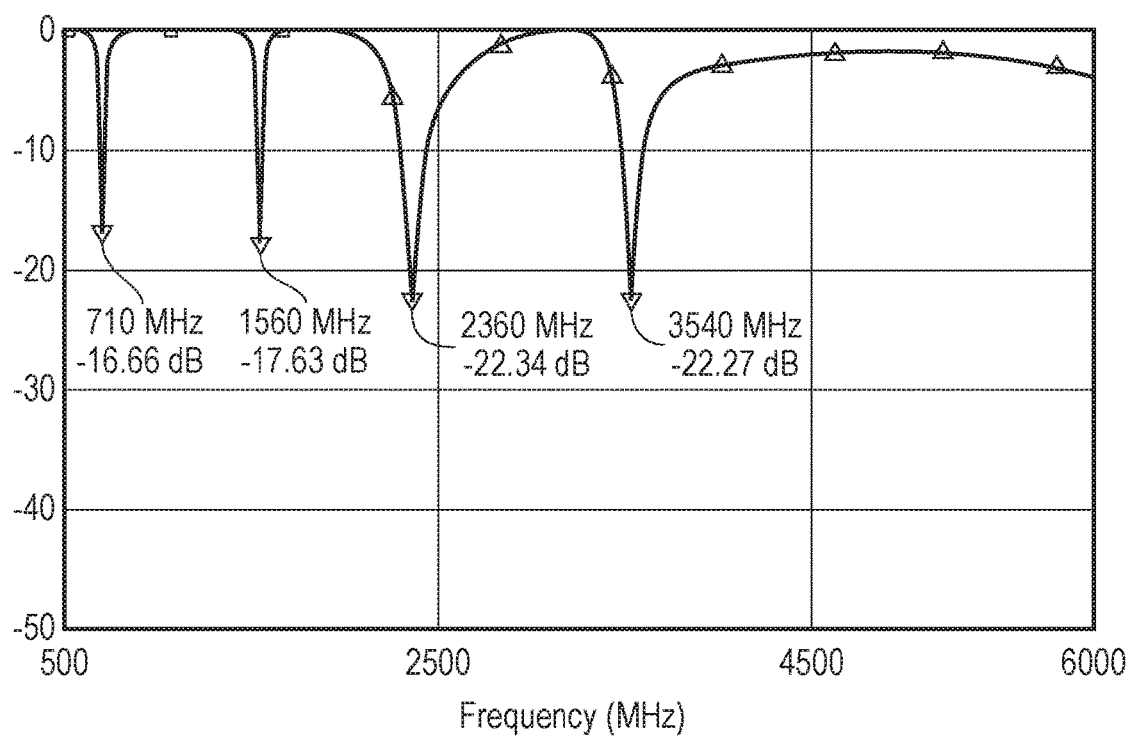
FIG. 11 shows a return loss plot for the second embodiment.

FIG. 11 shows a return loss plot for the embodiment of FIGS. 9 and 10. Four RF signals are shown, respectively at 710 MHz, 1560 MHz, 2360 MHz and 3540 MHz. Each of these RF signals is tuneable independently of the others by adjusting the variable capacitor(s) in the respective matching circuits 8, 9, 8', 9'.

Figure 12:
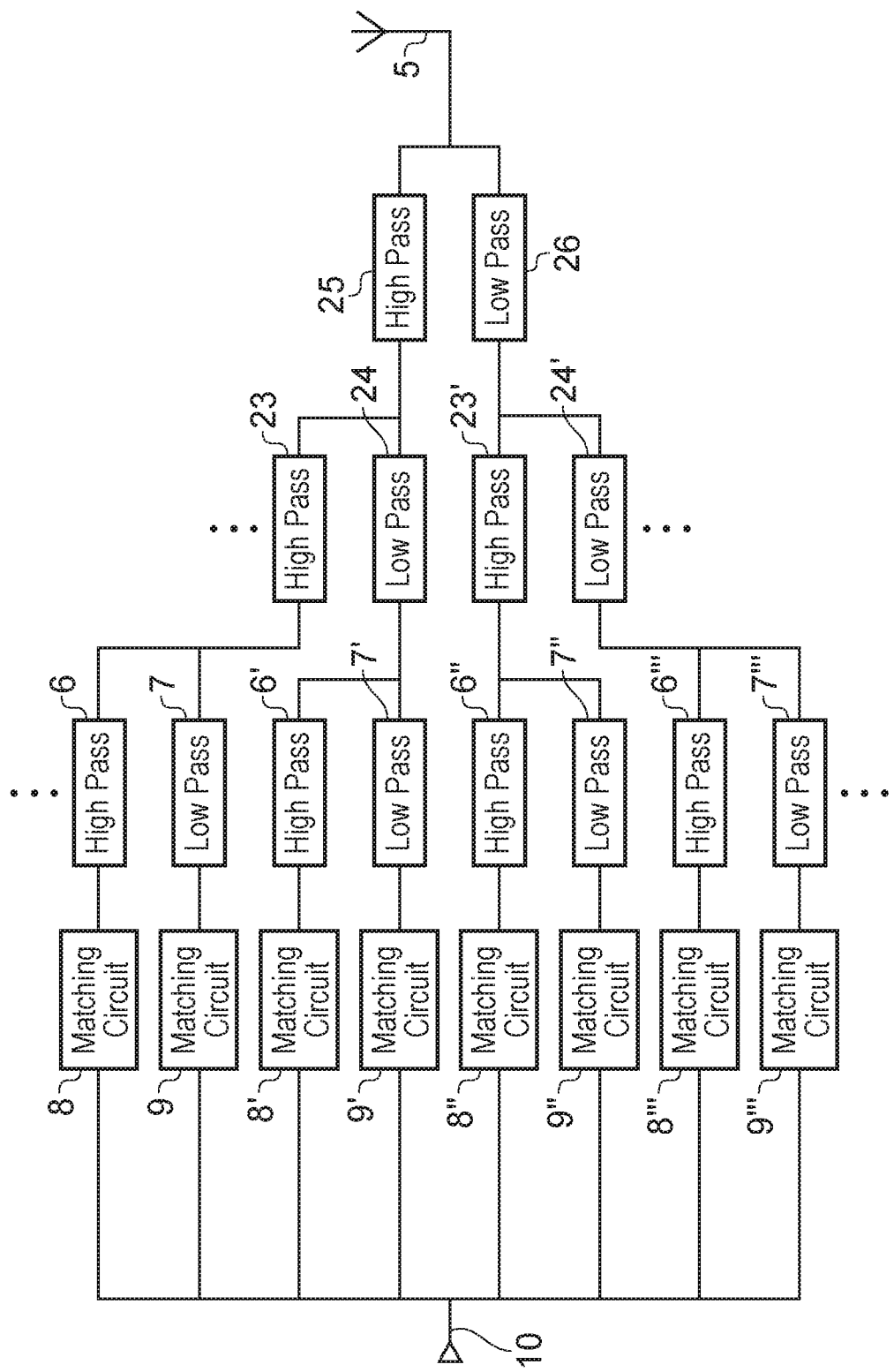
FIG. 12 shows a system block of a third embodiment.

FIG. 12 is a system block showing a further development. Here, the mixed RF signal from the antenna 5 is split by a first high pass filter 25 and a first low pass filter 26. The first high pass filter 25 is in turn connection to a second high pass filter 23 and a second low pass filter 24. The first low pass filter 26 is in turn connected to a second high pass filter 23' and a second low pass filter 24'. Each of the second high pass filters 23, 23' and low pass filters 24, 24' are in turn connected to a high pass filter 6, 6', 6", 6''' and a low pass filter 7, 7', 7", 7''' that are arranged in parallel. Each high pass filter 6, 6', 6", 6''' is connected to a respective matching circuit 8, 8', 8", 8''', and each low pass filter 7, 7', 7", 7''' to a respective matching circuit 9, 9', 9", 9'''.

It will be understood that additional high pass and low pass filters may be provided following this pattern so as to allow any given number of independent matching circuits to be implemented.

Figure 13:
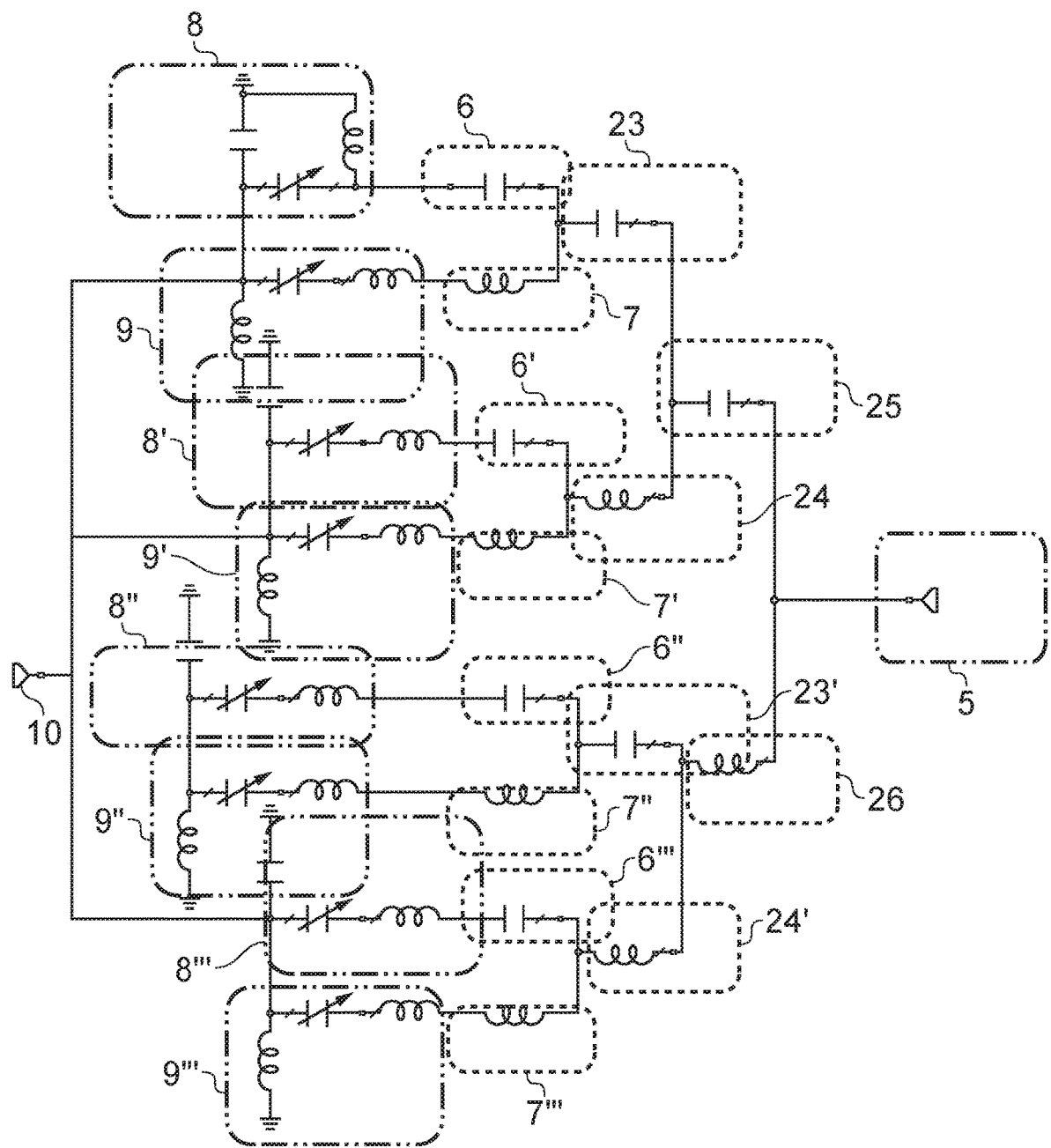
FIG. 13 shows an exemplary circuit schematic for the third embodiment.

FIG. 13 shows a circuit schematic illustrating one possible way in which the system block of FIG. 12 may be implemented, which will be understood with reference to FIGS. 3 and 10.

Figure 14:
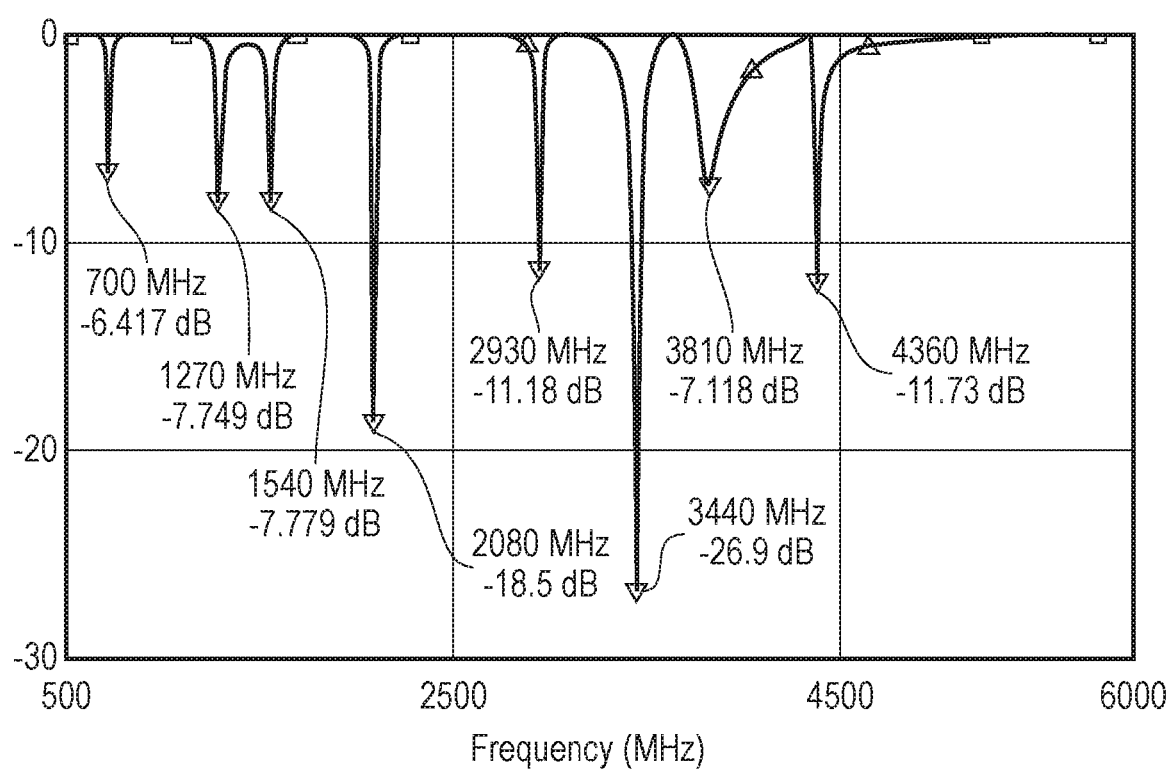
FIG. 14 shows a return loss plot for the third embodiment.

FIG. 14 shows a return loss plot for the embodiment of FIGS. 12 and 13. Eight RF signals are shown, respectively at 700 MHz, 1270 MHz, 1540 MHz, 2080 MHz, 2930 MHz, 3440 MHz, 3810 MHz and 4360 MHz. Each of these RF signals is tuneable independently of the others by adjusting the variable capacitor(s) in the respective matching circuits 8, 9, 8', 9', 8", 9", 8''', 9'''.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A multi-band reconfigurable antenna device comprising:
   at least one radiating element having a single feed;
   a first high pass filter having an input and an output, the first high pass filter allowing passage of a first RF signal;
   a first low pass filter having an input and an output, the first low pass filter allowing passage of a second RF signal;
   wherein the inputs of the first high pass filter and the first low pass filter are connected in parallel to the single feed and wherein the first high pass filter blocks passage of the second RF signal and the first low pass filter blocks passage of the first RF signal;
   a second high pass filter having an input and an output, the second high pass filter allowing passage of a third RF signal;
   a second low pass filter having an input and an output, the second low pass filter allowing passage of a fourth RF signal;
   wherein the inputs of the second high pass filter and the second low pass filter are connected in parallel to the output of the first high pass filter and wherein the second high pass filter blocks passage of the fourth RF signal and the second low pass filter blocks passage of the third RF signal;
   a third high pass filter having an input and an output, the third high pass filter allowing passage of a fifth RF signal;
   a third low pass filter having an input and an output, the third low pass filter allowing passage of a sixth RF signal;
   wherein the inputs of the third high pass filter and the third low pass filter are connected in parallel to the output of the first low pass filter and wherein the third high pass filter blocks passage of the sixth RF signal and the third low pass filter blocks passage of the fifth RF signal;
   a first matching circuit having an input and an output, the input connected to the output of the second high pass filter;
   a second matching circuit having an input and an output, the input connected to the output of the second low pass filter;
   a third matching circuit having an input and an output, the input connected to the output of the third high pass filter;
   a fourth matching circuit having an input and an output, the input connected to the output of the third low pass filter;
   wherein the outputs of the first to fourth matching circuits are connected in parallel to a single port.

2. A device as claimed in claim 1, further comprising a conductive groundplane.

3. A device as claimed in claim 2, wherein the first and second RF signals are of different frequencies and excite first and second simultaneous different resonances on the groundplane.

4. A device as claimed in claim 3, wherein the matching circuit and groundplane geometry are configured such that the first and second simultaneous resonances comprise surface currents distributed over different regions of the groundplane so as to reduce interactions with each other.

5. A device as claimed in claim 1, in combination with a mixed signal RF module connected to the port.

6. A device as claimed in claim 1, wherein the first to fourth matching circuits are adjustable independently of each other so as to allow the frequency of one of the third to sixth RF signals to be changed without simultaneously affecting the frequency of others of the third to sixth RF signals before the third to sixth RF signals are applied together to the single port for subsequent signal processing.

7. A multi-band reconfigurable antenna device comprising:
   at least one radiating element having a single feed;
   a first high pass filter having an input and an output, the first high pass filter allowing passage of a first RF signal;
   a first low pass filter having an input and an output, the first low pass filter allowing passage of a second RF signal;
   wherein the inputs of the first high pass filter and the first low pass filter are connected in parallel to the single feed and wherein the first high pass filter blocks passage of the second RF signal and the first low pass filter blocks passage of the first RF signal;
   a second high pass filter having an input and an output, the second high pass filter allowing passage of a third RF signal;
   a second low pass filter having an input and an output, the second low pass filter allowing passage of a fourth RF signal;
   wherein the inputs of the second high pass filter and the second low pass filter are connected in parallel to the output of the first high pass filter and wherein the second high pass filter blocks passage of the fourth RF signal and the second low pass filter blocks passage of the third RF signal;
   a third high pass filter having an input and an output, the third high pass filter allowing passage of a fifth RF signal;
   a third low pass filter having an input and an output, the third low pass filter allowing passage of a sixth RF signal;
   wherein the inputs of the third high pass filter and the third low pass filter are connected in parallel to the output of the first low pass filter and wherein the third high pass filter blocks passage of the sixth RF signal and the third low pass filter blocks passage of the fifth RF signal;
   a fourth high pass filter having an input and an output, the fourth high pass filter allowing passage of a seventh RF signal;
   a fourth low pass filter having an input and an output, the fourth low pass filter allowing passage of an eighth RF signal;
   wherein the inputs of the fourth high pass filter and the fourth low pass filter are connected in parallel to the output of the second high pass filter and wherein the fourth high pass filter blocks passage of the eighth RF signal and the fourth low pass filter blocks passage of the seventh RF signal;
a fifth high pass filter having an input and an output, the fifth high pass filter allowing passage of a ninth RF signal;
a fifth low pass filter having an input and an output, the fifth low pass filter allowing passage of a tenth RF signal;
wherein the inputs of the fifth high pass filter and the fifth low pass filter are connected in parallel to the output of the second low pass filter and wherein the fifth high pass filter blocks passage of the tenth RF signal and the fifth low pass filter blocks passage of the ninth RF signal;
a sixth high pass filter having an input and an output, the sixth high pass filter allowing passage of an eleventh RF signal;
a sixth low pass filter having an input and an output, the sixth low pass filter allowing passage of a twelfth RF signal;
wherein the inputs of the sixth high pass filter and the sixth low pass filter are connected in parallel to the output of the third high pass filter and wherein the sixth high pass filter blocks passage of the twelfth RF signal and the sixth low pass filter blocks passage of the eleventh RF signal;
a seventh high pass filter having an input and an output, the seventh high pass filter allowing passage of a thirteenth RF signal;
a seventh low pass filter having an input and an output, the seventh low pass filter allowing passage of a fourteenth RF signal;
wherein the inputs of the seventh high pass filter and the seventh low pass filter are connected in parallel to the output of the third low pass filter and wherein the seventh high pass filter blocks passage of the fourteenth RF signal and the sixth low pass filter blocks passage of the thirteenth RF signal;
a first matching circuit having an input and an output, the input connected to the output of the fourth high pass filter;
a second matching circuit having an input and an output, the input connected to the output of the fourth low pass filter;
a third matching circuit having an input and an output, the input connected to the output of the fifth high pass filter;
a fourth matching circuit having an input and an output, the input connected to the output of the fifth low pass filter;
a fifth matching circuit having an input and an output, the input connected to the output of the sixth high pass filter;
a sixth matching circuit having an input and an output, the input connected to the output of the sixth low pass filter;
a seventh matching circuit having an input and an output, the input connected to the output of the seventh high pass filter;
an eighth matching circuit having an input and an output, the input connected to the output of the seventh low pass filter;
wherein the outputs of the first to eighth matching circuits are connected in parallel to a single port.

8. A device as claimed in claim 7, wherein the first to eighth matching circuits are adjustable independently of each other so as to allow the frequency of one of the seventh to fourteenth RF signals to be changed without simultaneously affecting the frequency of others of the seventh to fourteenth RF signals before the seventh to fourteenth RF signals are applied together to the single port for subsequent signal processing.

9. A device as claimed in claim 7, further comprising a conductive groundplane.

10. A device as claimed in claim 9, wherein the first and second RF signals are of different frequencies and excite first and second simultaneous different resonances on the groundplane.

11. A device as claimed in claim 10, wherein the matching circuit and groundplane geometry are configured such that the first and second simultaneous resonances comprise surface currents distributed over different regions of the groundplane so as to reduce interactions with each other.

12. A device as claimed in claim 7, in combination with a mixed signal RF module connected to the port.

13. A multi-band reconfigurable antenna device comprising:
at least one radiating element having a single feed;
a first high pass filter having an input and an output, the first high pass filter allowing passage of a first RF signal;
a first low pass filter having an input and an output, the first low pass filter allowing passage of a second RF signal;
wherein the inputs of the first high pass filter and the first low pass filter are connected in parallel to the single feed and wherein the first high pass filter blocks passage of the second RF signal and the first low pass filter blocks passage of the first RF signal;
a second high pass filter having an input and an output, the second high pass filter allowing passage of a third RF signal;
a second low pass filter having an input and an output, the second low pass filter allowing passage of a fourth RF signal;
wherein the inputs of the second high pass filter and the second low pass filter are connected in parallel to the output of the first high pass filter and wherein the second high pass filter blocks passage of the fourth RF signal and the second low pass filter blocks passage of the third RF signal;
a third high pass filter having an input and an output, the third high pass filter allowing passage of a fifth RF signal;
a third low pass filter having an input and an output, the third low pass filter allowing passage of a sixth RF signal;
wherein the inputs of the third high pass filter and the third low pass filter are connected in parallel to the output of the first low pass filter and wherein the third high pass filter blocks passage of the sixth RF signal and the third low pass filter blocks passage of the fifth RF signal;
wherein the outputs of the second and third high pass filter and low pass filters are respectively connected to further high pass and low pass filters following a cascade topology;
first to nth matching circuits each having an input and an output, where n is an integer corresponding to the number of outputs of the high pass and low pass filters in a final stage of the cascade topology, the input of each matching circuit connected to the output of a different one of the high pass filters and low pass filters in the final stage of the cascade topology;

wherein the outputs of the first to nth matching circuits are connected in parallel to a single port.

14. A device as claimed in claim 13, further comprising a conductive groundplane.

15. A device as claimed in claim 14, wherein the first and second RF signals of different frequencies excite first and second simultaneous different resonances on the groundplane.

16. A device as claimed in claim 15, wherein the matching circuit and groundplane geometry are configured such that the first and second simultaneous resonances comprise surface currents distributed over different regions of the groundplane so as to reduce interactions with each other.

17. A device as claimed in claim 13, in combination with a mixed signal RF module connected to the port.

* * * * *